(12) United States Patent
Kim et al.

(10) Patent No.: US 9,368,754 B2
(45) Date of Patent: Jun. 14, 2016

(54) DISPLAY DEVICE

(71) Applicant: SAMSUNG DISPLAY CO., LTD., Yongin, Gyeonggi-Do (KR)

(72) Inventors: Hyun Ho Kim, Hwaseong-si (KR); Chung Sock Choi, Seoul (KR); Soo Youn Kim, Siheung-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/681,256

(22) Filed: Apr. 8, 2015

(65) Prior Publication Data

US 2016/0049612 A1 Feb. 18, 2016

(30) Foreign Application Priority Data

Aug. 14, 2014 (KR) .................... 10-2014-0105810

(51) Int. Cl.
*H01L 33/00* (2010.01)
*H01L 51/52* (2006.01)
*H01L 27/32* (2006.01)
*H01L 33/12* (2010.01)

(52) U.S. Cl.
CPC ........ *H01L 51/5268* (2013.01); *H01L 27/3211* (2013.01); *H01L 33/12* (2013.01)

(58) Field of Classification Search
CPC .. H01L 27/3211; H01L 33/12; H01L 51/5268

USPC ........................................................... 257/88
See application file for complete search history.

(56) References Cited

U.S. PATENT DOCUMENTS

| 2012/0104372 | A1  | 5/2012  | Kim et al. |
|---|---|---|---|
| 2013/0069524 | A1  | 3/2013  | Takai et al. |
| 2013/0228801 | A1* | 9/2013  | Lee ...................... H01L 51/5268 257/88 |
| 2013/0320842 | A1  | 12/2013 | Park et al. |
| 2014/0199797 | A1  | 7/2014  | Moon et al. |
| 2015/0162363 | A1* | 6/2015  | Kim .................... H01L 27/1262 257/72 |
| 2015/0255754 | A1* | 9/2015  | Moon ................. H01L 51/5268 257/89 |

FOREIGN PATENT DOCUMENTS

| KR | 10-2012-0047103 A | 5/2012 |
|---|---|---|
| KR | 10-2012-0138037 A | 12/2012 |
| KR | 10-2013-0016937 A | 2/2013 |
| KR | 10-2013-0045267 A | 5/2013 |
| KR | 10-2013-0134919 A | 12/2013 |

* cited by examiner

*Primary Examiner* — David S Blum
(74) *Attorney, Agent, or Firm* — Lee & Morse, P.C.

(57) ABSTRACT

A display device includes a first substrate, a pixel defining layer on the first substrate, the pixel defining layer defining a pixel region on the first substrate, a first electrode on the pixel region, a light emitting layer on the first electrode, a second electrode on the light emitting layer, a second substrate facing the first substrate, and a light scattering layer overlapping the pixel defining layer, the light scattering layer having a non-overlapping relationship with the light emitting layer.

20 Claims, 6 Drawing Sheets

DISPLAY DEVICE

CROSS-REFERENCE TO RELATED APPLICATION

Korean Patent Application No. 10-2014-0105810, filed on Aug. 14, 2014, in the Korean Intellectual Property Office, and entitled: "Display Device," is incorporated by reference herein in its entirety.

BACKGROUND

1. Field

The present disclosure relates to a display device with an improved viewing angle property.

2. Description of the Related Art

In general, flat panel display devices, e.g., a liquid crystal display device or an organic light emitting diode display device, include a plurality of pairs of electrodes generating an electric field and an electro-optical active layer interposed therebetween. For example, the liquid crystal display device includes a liquid crystal layer as the electro-optical active layer, and the organic light emitting diode (OLED) display includes an organic light emitting layer as the electro-optical active layer.

In general, the OLED display is capable of expressing colors by recombining electrons and holes injected from an anode and a cathode in a light emitting unit. For example, the OLED display may have a multi-layer laminated structure where a light emitting layer is interposed between a pixel electrode serving as the anode and a facing electrode serving as the cathode. Sub pixels of red, green, and blue pixels may be arranged in a unit pixel of such an OLED display, and a desired color can be expressed by combining colors of the three sub pixels. That is, each sub-pixel has a structure where a light emitting layer configured to emit light having one of red, green, and blue colors is interposed between two electrodes, and the lights of the three colors are properly combined to express a color of the unit pixel.

SUMMARY

The present disclosure is directed to a display device including a light scattering layer overlapping a pixel defining layer.

According to an embodiment, a display device may include a first substrate; a pixel defining layer configured to define pixel regions on the first substrate; a first electrode disposed on the pixel region; a light emitting layer disposed on the first electrode; a second electrode disposed on the light emitting layer; a second substrate disposed to face the first substrate; and a light scattering layer overlapping the pixel defining layer and not overlapping the light emitting layer.

The light emitting layer and the light scattering layer may have an area ratio of 1:1 to 1:2.3.

The light scattering layer may be disposed between the second substrate and the pixel defining layer.

The light scattering layer may be disposed on a bottom surface of the second substrate facing the pixel defining layer.

The light scattering layer may include a first optical layer and a second optical layer having different refractive indices from each other.

The second optical layer may be disposed on the first optical layer.

The first optical layer and the second optical layer may have a prism form.

The light scattering layer may include a base layer and a light scattering particle disposed inside the base layer.

The light scattering layer may be disposed between the first substrate and the pixel defining layer.

The display device may further include a buffer layer disposed between the pixel defining layer and the first substrate.

The buffer layer may be disposed between the pixel defining layer and the light scattering layer.

According to another embodiment, a display device may include a substrate; a pixel defining layer configured to define pixel regions on the substrate; a first electrode disposed on the pixel region; a light emitting layer disposed on the first electrode; a second electrode disposed on the light emitting layer; a thin film encapsulation layer disposed on the second electrode; and a light scattering layer overlapping the pixel defining layer and not overlapping the light emitting layer.

The light emitting layer and the light scattering layer may have an area ratio of 1:1 to 1:2.3.

The light scattering layer may be disposed on the thin film encapsulation layer.

The light scattering layer may include a first optical layer and a second optical layer having different refractive indices from each other.

The second optical layer may be disposed on the first optical layer.

The first optical layer and the second optical layer may have a prism form.

The light scattering layer may include a base layer and a light scattering particle disposed inside the base layer.

The light scattering layer may be disposed between the first substrate and the pixel defining layer.

The display device may further include a buffer layer disposed between the pixel defining layer and the first substrate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
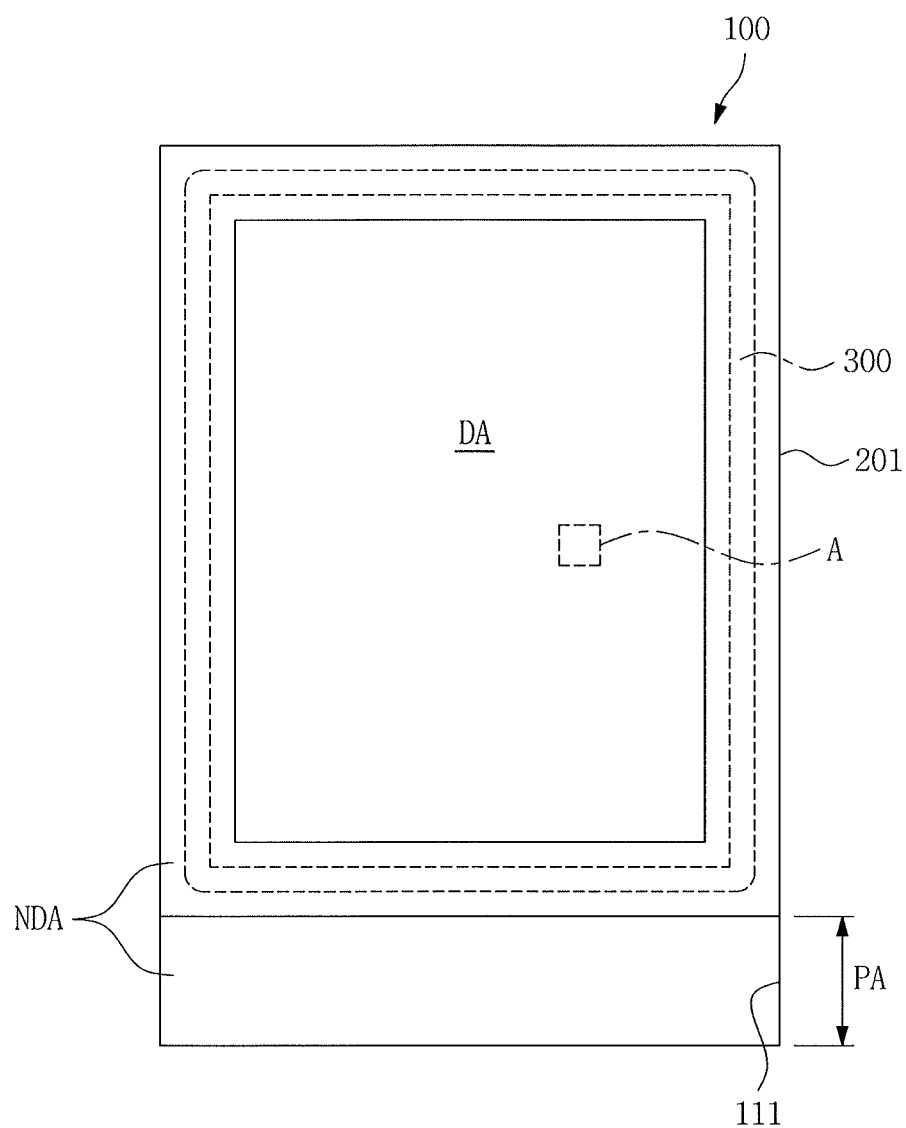
FIG. 1 illustrates a schematic plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element is referred to as being "on" another layer or substrate, it can be directly on the other element or substrate, or intervening elements may also be present. In addition, it will also be understood that when an element is referred to as being "between" two elements or "connected" to another element, it can be the only element between the two elements or connected to the other element, or one or more intervening elements may also be present, e.g., an element ca be "electrically connected" to the other element with one or more intervening elements interposed therebetween. Like reference numerals refer to like elements throughout.

It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. Also, some of the parts which are not associated with the description may not be provided in order to specifically describe embodiments.

It will also be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Hereinafter, a display device according to an embodiment will be described in detail with reference to FIGS. 1 to 5. The display device according to the embodiment may be an OLED display or an LCD device. Hereinafter, it is assumed that the OLED is used as the display device according to one embodiment.

Figure 2:
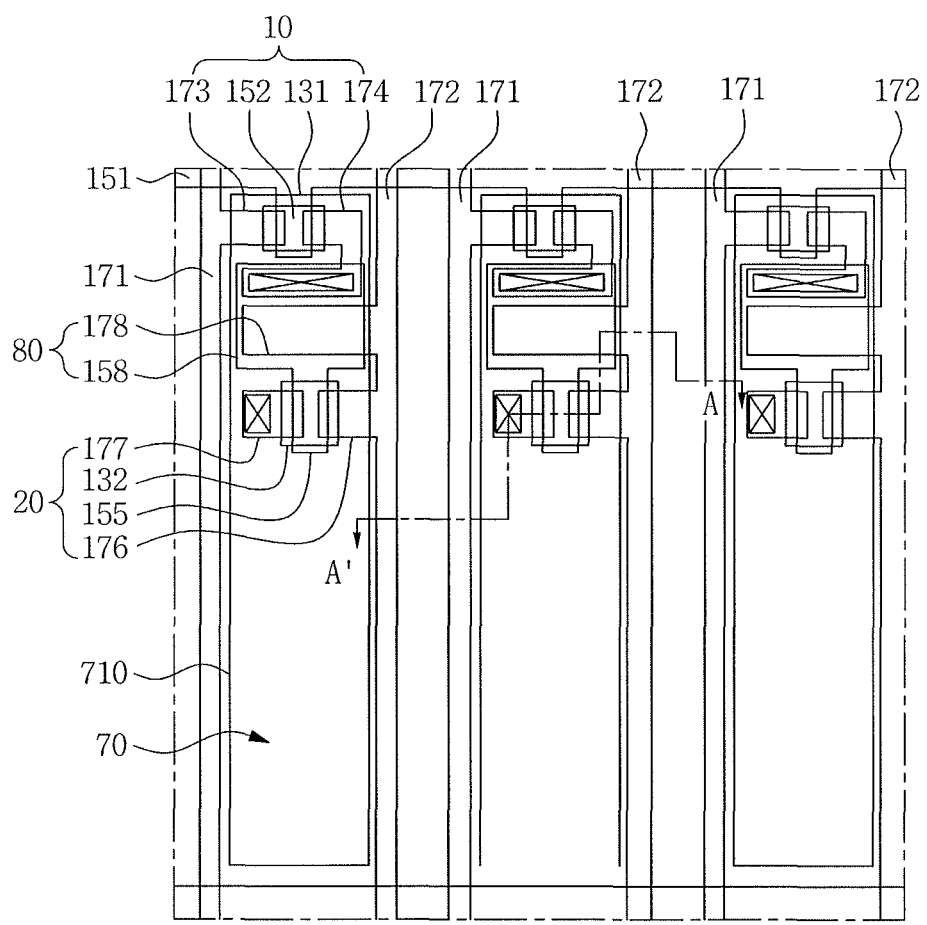
FIG. 2 illustrates an enlarged plan view of part A of FIG. 1.
Figure 3:
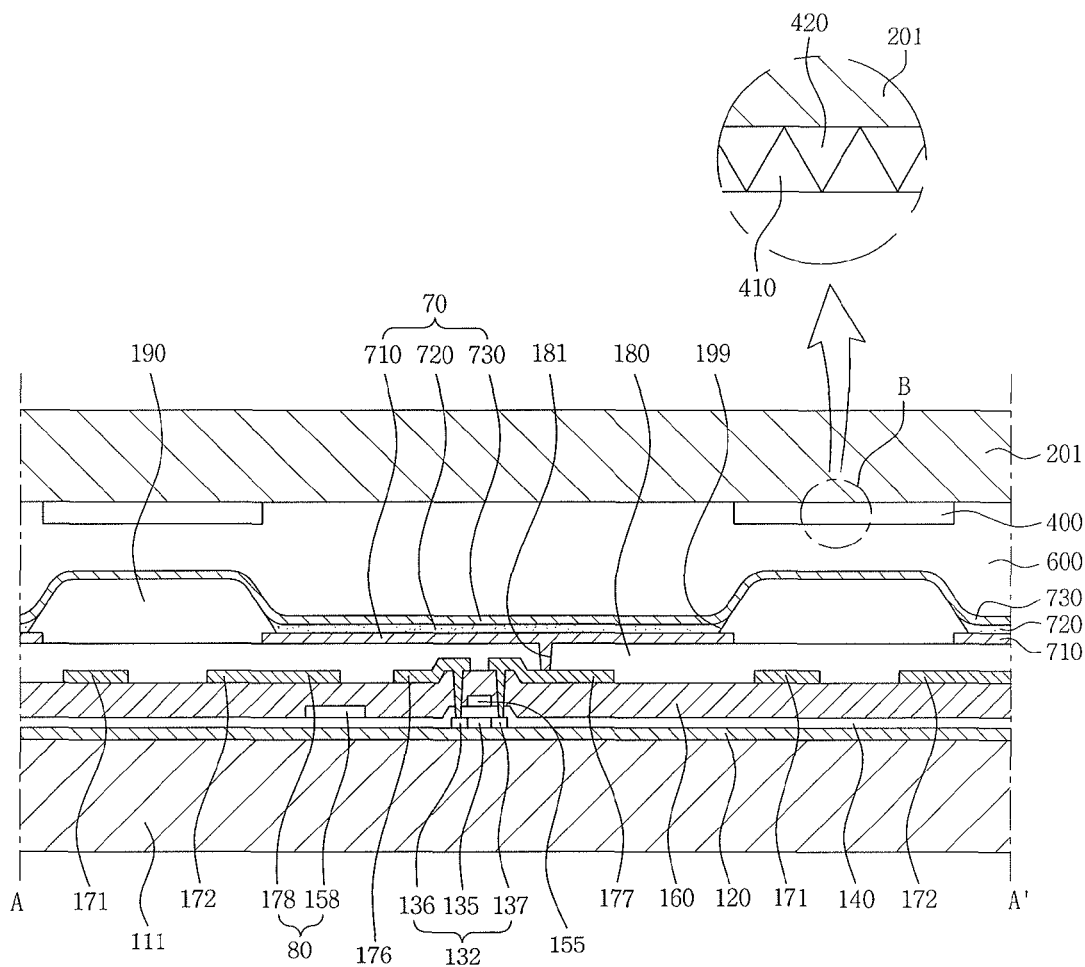
FIGS. 3 and 4 illustrate cross-sectional views along line A-A' of FIG. 2.
Figure 4:
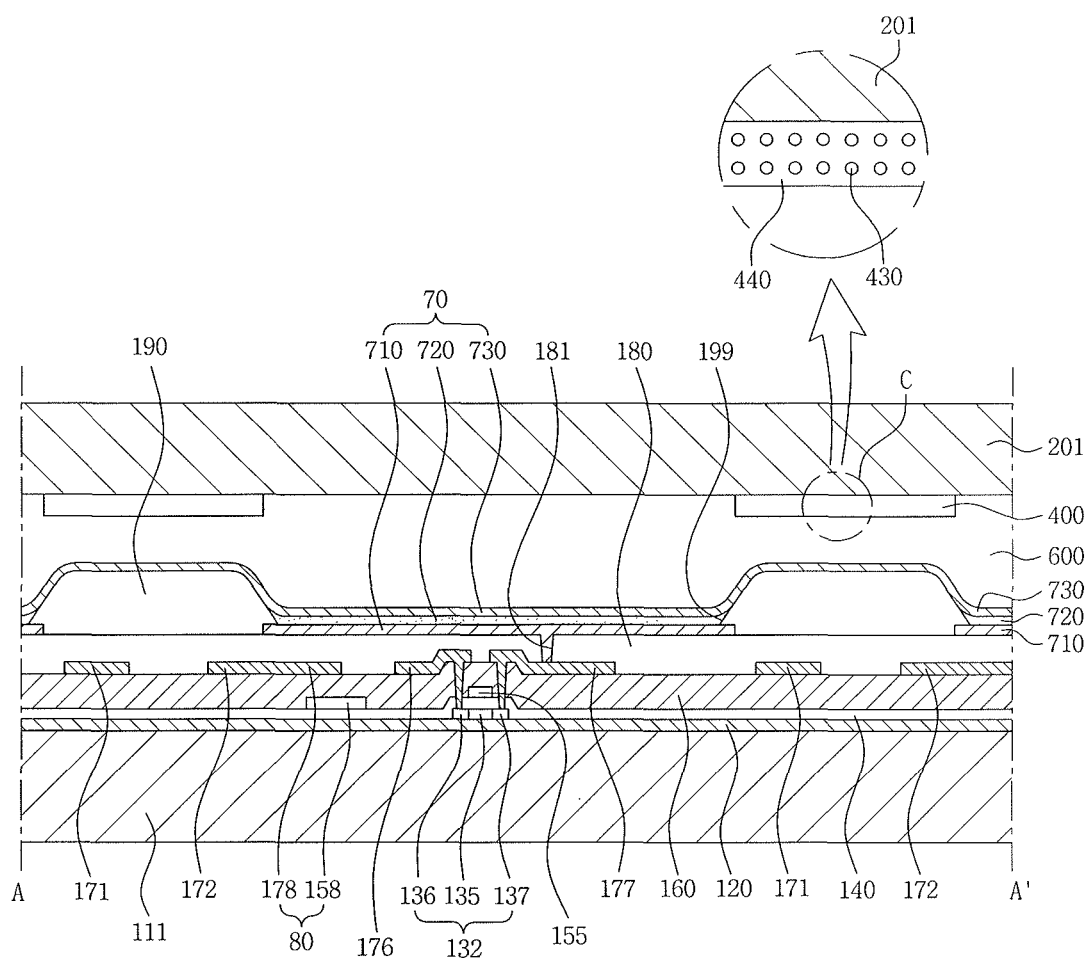
Figure 5:
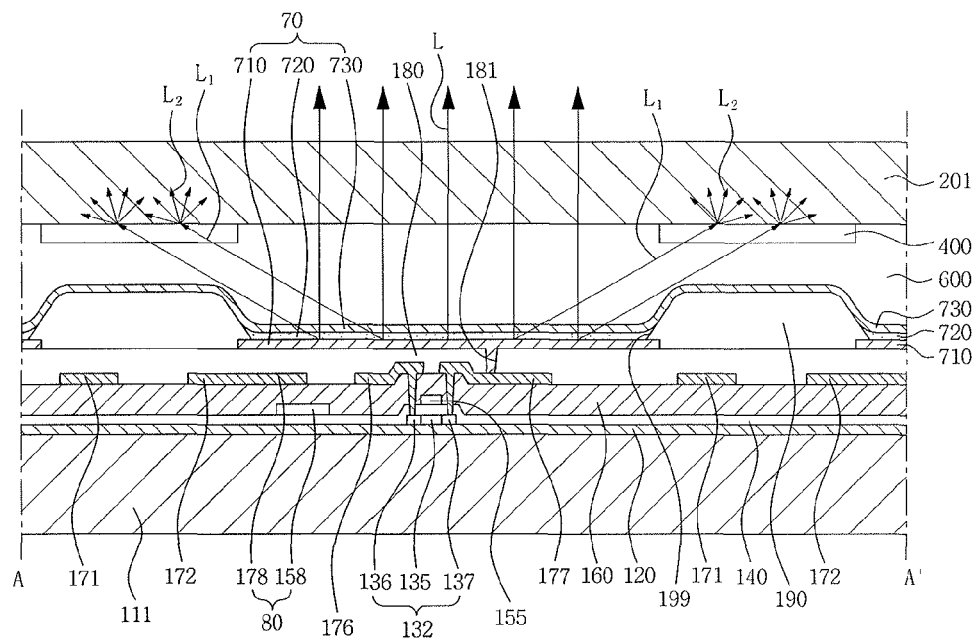
FIG. 5 illustrates a cross-sectional view of a light scattering effect when a light scattering layer is applied.

FIG. 1 is a schematic plan view illustrating the display device according to one embodiment. FIG. 2 is a plan view enlarging part A of FIG. 1. FIGS. 3 and 4 are cross-sectional views taken along line A-A' of FIG. 2. FIG. 5 is a cross-sectional view illustrating a light scattering effect when a light scattering layer is used.

Referring to FIG. 1, an organic light emitting display device 100 according to an embodiment may include a first substrate 111, a second substrate 201, and a sealing member 300. However, embodiments are not limited thereto, e.g., the first substrate 111 may be encapsulated by an encapsulation film and the like other than the second substrate 201.

The first substrate 111 may include a display area DA for displaying images by light emission, and a non-display area NDA disposed outside of the display area DA. For example, an OLED and a thin film transistor with lines for driving the OLED may be formed on the display area DA. The non-display area NDA may include a pad area PA on which a plurality of pad electrodes (not illustrated) are formed. The plurality of pad electrodes is configured to receive an external signal for allowing the OLED to emit light and supply the external signal to the OLED.

The organic light emitting display device 100 according to an embodiment may be implemented as a top-emission type, a bottom-emission type, and both-side-emission type. Hereinafter, for ease of description, it is assumed that a top-emission type is used as an embodiment.

Hereinafter, a display area DA according to an embodiment will be described with reference to FIGS. 2 and 3. Although FIGS. 2 and 3 illustrate an active-matrix (AM)-type OLED display having a 2Tr-1Cap structure, which includes two thin film transistors TFTs 10 and 20 and a capacitor 80 in one pixel, embodiments are not limited thereto. For example, in some embodiments, an organic light emitting display device according to an embodiment may have many different structures including three or more TFTs and two or more capacitors in one pixel, and may further include additional lines. Herein, the term "pixel" refers to a smallest unit for displaying an image, and the display area displays an image using a plurality of pixels.

Referring to FIGS. 2-3, the organic light emitting display device 100 according to an embodiment may include the first substrate 111 and a plurality of pixels defined on the first substrate 111. Each of the plurality of pixels may include a switching TFT 10, a driving TFT 20, the capacitor 80, and an OLED 70. In addition, the first substrate 111 may include a gate line 151 arranged along one direction, and a data line 171 and a common power line 172 insulated from and intersecting the gate line 151. Herein, the pixel may be generally defined by the gate line 151, the data line 171, and the common power source line 172, but is not limited thereto.

The OLED 70 may include a first electrode 710, an organic light emitting layer 720 formed on the first electrode 710, and a second electrode 730 formed on the organic light emitting layer 720. Herein, one or more first electrodes 710 are formed on each pixel, and thus the first substrate 111 may include a plurality of first electrodes 710 spaced apart from each other.

Herein, the first electrode 710 is a positive end portion (anode) serving as a hole injecting electrode, and the second electrode 730 is a negative end portion (cathode) serving as an electron injecting electrode. However, embodiments are not limited thereto, and thus the first electrode 710 may function as a cathode, and the second electrode 730 may function as an anode according to a method of driving the OLED display. Further, the first electrode 710 may be a pixel electrode and the second electrode 730 may be a common electrode.

In the OLED, a hole and an electron injected to the light emitting layer 720 are combined with each other to form an exciton. The OLED emits light by energy generated when the exciton falls from an excited state to a ground state.

The capacitor 80 may include a pair of storage electrodes 158 and 178 with an interlayer insulating layer 160 interposed therebetween. Herein, the interlayer insulating layer 160 may be a dielectric material. Capacitance of the capacitor 80 may be determined by electric charges stored in the capacitor 80 and voltage across the pair of storage electrodes 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177.

The switching TFT 10 may function as a switching device which selects a pixel to perform light emission. The switching gate electrode 152 may be connected to the gate line 151, and the switching source electrode 173 may be connected to the data line 171. The switching drain electrode 174 may be spaced apart from the switching source electrode 173 and may be connected to the first storage electrode 158.

The driving TFT 20 may apply a driving power to the first electrode 710, which allows the light emitting layer 720 of the OLED 70 in a selected pixel to emit light. The driving gate electrode 155 may be connected to the first storage electrode 158 that is connected to the switching drain electrode 174. The driving source electrode 176 and the second storage electrode 178 may be respectively connected to the common power line 172. The driving drain electrode 177 may be connected to the first electrode 710 of the OLED 70 through a drain contact hole 181.

With the above-described structure, the switching TFT 10 may be operated by a gate voltage applied to the gate line 151, and may function to transmit a data voltage applied to the data line 171 to the driving TFT 20. Voltage equivalent to a difference between a common voltage applied from the common power line 172 to the driving TFT 20 and the data voltage transmitted from the switching TFT 10 may be stored in the capacitor 80, and current corresponding to the voltage stored in the capacitor 80 may flow to the OLED 70 through the driving TFT 20, so that the OLED 70 may emit light.

A structure of the organic light emitting display device 100 according to an embodiment will be described in more detail with reference to FIGS. 2 and 3.

The OLED display 70, the driving TFT 20, the capacitor 80, the data line 171, and the common power line 172 illustrated in FIG. 3 will be mainly described. Further, a switching semiconductor layer 131, a switching gate electrode, switching source and drain electrodes 173 and 174 of the switching TFT 10 may have the same laminated structure as the driving semiconductor layer 132, the driving gate electrode 155, the driving source and drain electrodes 176 and 177 of the driving TFT 20, and thus their repeated description will not be provided.

According to an embodiment, the first substrate 111 may be made of a first insulating substrate, e.g., at least one of glass, quartz, ceramic, plastic and the like. However, embodiments are not limited thereto. For example, the first substrate 111 may be made of metal, e.g., stainless steel and the like.

A buffer layer 120 may be disposed on the first substrate 111. The buffer layer 120 may reduce or prevent penetration of undesirable elements and planarize a surface, and may include various materials in accordance therewith. For instance, the buffer layer 120 may be made of at least one of silicon nitride ($SiN_x$), a silicon oxide ($SiO_2$), and a silicon oxynitride ($SiO_xN_y$). However, the buffer layer 120 may not be always necessary and may be omitted according to the kind of the first substrate 111 and process conditions thereof.

The driving semiconductor layer 132 may be disposed on the buffer layer 120. The driving semiconductor layer 132 may include at least one semiconductor material of, e.g., polycrystalline silicon, amorphous silicon, and oxide semiconductors. Further, the driving semiconductor layer 132 may have a channel region 135 that is not doped with impurities and p+ doped source and drain regions 136 and 137 that are formed on both sides of the channel region 135. In this case, p-type impurities, e.g., boron (B) and diborane ($B_2H_6$), may be used as dopant ions. Such impurities may vary depending on the kinds of the TFTs.

A gate insulating layer 140, e.g., made of silicon nitride or silicon oxide, is disposed on the driving semiconductor layer 132. The gate insulating layer 140 may include at least one of tetraethylorthosilicate (TEOS), a silicon nitride ($SiN_x$), and a silicon oxide ($SiO_2$). For example, the gate insulating layer 140 may have a double-layer structure where a $SiN_x$ layer having a thickness of about 40 nm and a TEOS layer having a thickness of about 80 nm are sequentially laminated. However, the gate insulating layer 140 according to an embodiment is not limited thereto.

A driving gate electrode 155, a gate line (reference number 151 of FIG. 1), and the first storage electrode 158 are formed on the gate insulating layer 140. In this case, the driving gate electrode 155 is disposed to overlap at least a part of the driving semiconductor layer 132, i.e., at least a part of the channel region 135. The driving gate electrode 155 may prevent the channel region 135 from being doped with impurities when the drain and source regions 136 and 137 of the driving semiconductor layer 132 are doped with the impurities in the process of forming the driving semiconductor layer 132.

The gate electrode 155 and the first storage electrode 158 may be disposed on the same layer, e.g., may both be disposed directly on the gate insulating layer 140, and may be made of substantially the same metal material. For example, the gate electrode 155 and the first storage electrode 158 may include metal material, e.g., at least one of molybdenum (Mo), chromium (Cr), and tungsten (W). For example, the gate electrode 155 and the first storage electrode 158 may be made of molybdenum (Mo) or molybdenum alloys.

The insulating layer 160 configured to cover the driving gate electrode 155 is disposed on the gate insulating layer 140. The insulating layer 160 may be an interlayer insulating layer. The insulating layer 160 may be made, e.g., of silicon nitride ($SiN_x$) or a silicon oxide ($SiO_x$), like the gate insulating layer 140. The gate insulating layer 140 and the insulating layer 160 have a contact hole to expose the source and drain regions of the driving semiconductor layer 132.

The driving source electrode 176, the driving drain electrode 177, the data line 171, the common power line 172, and the second storage electrode 178 may be disposed on the insulating layer 160 of the display area DA. The driving source electrode 176 and the driving drain electrode 177 may be respectively connected to the source and drain regions of the driving semiconductor layer 132 through the contact hole.

In more detail, the driving source electrode 176, the driving drain electrode 177, the data line 171, the common power line 172, and the second storage electrode 178 may be formed of refractory metal including at least one selected of, e.g., molybdenum, chromium, tantalum, and titanium or metal alloys thereof, and may have a multi-layer structure including a refractory metal film and a low-resistance conductive film. Examples of the multi-layer structure may include a double-layer structure including a chromium or molybdenum (alloy) lower film and an aluminum (alloy) upper film, and a triple-layer structure including a molybdenum (alloy) lower film, an aluminum (alloy) intermediate film, and a molybdenum (alloy) upper film.

However, embodiments are not limited thereto, and the driving source electrode 176, the driving drain electrode 177, the data line 171, the common power line 172, and the second storage electrode 178 may be formed of various conductive materials other than the above-described materials. Accordingly, the driving thin film transistor 20 may be formed including the driving semiconductor layer 132, the driving gate electrode 155, the driving source electrode 176, and the driving drain electrode 177. However, the configurations of the driving thin film transistor 20 are not limited thereto, and thus may be adjustable to have many different structures.

A protective layer 180 configured to cover the driving source electrode 176, the driving drain electrode 177, and the like is disposed on the insulating layer 160. The protective layer 180 may be made of organic materials, e.g., polyacrylates and polyimides. The protective layer 180 may be a planarizing layer. The protective layer 180 may be formed of at least one of, e.g., polyacrylate resins, epoxy resins, phenolic resins, polyamide resins, polyimide reins, unsaturated polyester resins, poly-phenylenether resins, poly-phenylenesulfide resins, and benzocyclobutene (BCB).

The protective layer 180 has the drain contact hole 181 for exposing the driving drain electrode 177. The first electrode 710 is formed on the protective layer 180, and the first electrode 710 is connected to the driving drain electrode 177 through the drain contact hole 181 formed on the protective layer 180.

A pixel defining layer 190 is formed on the protective layer 180 and covers the first electrode 710. The pixel defining layer 190 has an opening 199 for exposing the first electrode 710. That is, the first electrode 710 is disposed to correspond to the opening 199 of the pixel defining layer 190. The pixel defining layer 190 may be made of a resin, e.g., a polyacrylate resin and/or a polyimide resin. Further, the pixel defining layer 190 may be made of a photosensitive organic material or a photosensitive polymer material. For example, the pixel defining layer 190 may be made of one of polyacrylates, polyimides, photo sensitive polyimides (PSPI), photosensitive acryl (PA), and photosensitive novolak resins.

The organic light emitting layer 720 is formed on the first electrode 710 in the opening 199 of the pixel defining layer 190, and the second electrode 730 is formed on the pixel defining layer 190 and the organic light emitting layer 720. Accordingly, the OLED 70 is formed including the first electrode 710, the organic light emitting layer 720, and the second electrode 730.

One of the first and second electrodes 710 and 730 is formed of a transparent conductive material and the other one thereof is formed of a transflective or reflective conductive material. Depending on the material forming the first and second electrodes 710 and 730, the organic light emitting display device 100 may become a top-emission type, a bottom-emission type, or a both-side-emission type.

For example, in a case where the organic light emitting display device 100 according to ab embodiment is a top-emission type, the first electrode 710 is formed of the transflective or reflective conductive material, and the second electrode 730 is formed of the transparent conductive material. At least one of, e.g., indium tin oxides (ITO), indium zinc oxides (IZO), zinc oxides (ZnO), and indium oxides ($In_2O_3$) may be used as the transparent conductive material. At least one of, e.g., lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

The organic light emitting layer 720 may be made of low molecular weight organic materials or high molecular weight organic materials. The organic light emitting layer 720 may have a multi-layer structure including a light emitting layer and at least one of a hole injection layer (HIL), a hole transporting layer (HTL), an electron transporting layer (ETL), and an electron injection layer (EIL). For example, the HIL may be disposed on the first electrode 710 that is a positive end portion, and the HTL, light emitting layer, ETL, and EIL may be sequentially laminated thereon.

According to an embodiment, the organic light emitting layer 720 is only formed inside the opening 199 of the pixel defining layer 190, but embodiments are not limited thereto. Therefore, at least one layer of the organic light emitting layer 720 may not only be disposed on the first electrode 710 inside the opening 199 of the pixel defining layer 190 but also be disposed between the pixel defining layer 190 and the second electrode 730. In more detail, HIL, HTL, ETL, EIL, and the like of the organic light emitting layer 720 may be formed at a position other than the opening 199 by the open mask, and the light emitting layer of the organic light emitting layer 720 may be formed on each opening 199 by the fine metal mask FMM.

In a case where the LCD display is used as an embodiment, the first electrode 710 is physically and electrically connected to the driving drain electrode 177 through the drain contact hole 181, and is applied with a data voltage from the driving drain electrode 177. The first electrode 710 applied with the data voltage forms an electric field with the second electrode (common electrode, not illustrated) applied with a common voltage, which determines an arrangement of the liquid crystal molecules of the liquid crystal layer (not illustrated) between the two electrodes. The first electrode 710 and the second electrode form a capacitor (hereinafter "a liquid crystal capacitor"), which maintains an applied voltage although the thin film transistor is turned off.

The second substrate 201 is bonded to the first substrate 111 with the OLED 70 interposed therebetween. The second substrate 201 is configured to cover and protect the thin film transistors 10 and 20, the OLED 70, and the like disposed on the first substrate 101 to be sealed from the outside. In general, an insulating substrate made of glasses or plastics may be used as the second substrate 201. In the case of the top-emission type where an image is displayed toward the second substrate 201, the second substrate 201 is formed of a light-transmissive material.

Meanwhile, a filling member 600 is disposed between the first substrate 101 and the second substrate 201. The filling member 600 is configured to protect inner components such as OLED 70 from external shock applied to the organic light emitting display device 100. The filling member 600 may improve physical reliability of the organic light emitting display device 100. The filling member 600 may include at least one of an organic sealant, e.g., urethane resins, epoxy resins, acrylic resins, or an inorganic sealant, e.g., silicon. The urethane resins may include, e.g., urethane acrylates. The acrylic resins may include, e.g., butyl acrylates, ethyl hexyl acrylates.

In the organic light emitting display device 100 with the above-described structure, an electrode disposed in a direction of displaying an image is formed as a transflective electrode, while an electrode disposed in the opposite side from the direction of displaying an image is formed as a reflective electrode. Therefore, the transflective with the reflective electrodes provide a resonance structure.

Such a resonance structure in a conventional organic light emitting display device may exhibit deterioration in the viewing angle property. Further, if a light scattering layer is formed on the light emitting area to improve the deteriorated viewing angle, luminance recognized from the front side may be reduced.

Therefore, the organic light emitting display device 100 according to an embodiment includes a light scattering layer 400 that overlaps the pixel defining layer 190, while not overlapping the light emitting layer 720. As such, the organic light emitting display device 100 according to an embodiment has a resonance structure designed to maintain a luminance level recognized from the front side and also exhibit an excellent viewing angle property.

In detail, as illustrated in FIG. 3, the organic light emitting display device 100 according to an embodiment includes the light scattering layer 400 that overlaps the pixel defining layer 190 and does not overlap the light emitting layer 720. In other words, as illustrated in FIG. 3, the light scattering layer 400 may extend only over the pixel defining layer 190, so the light scattering layer 400 and the light emitting layer 720 may have a non-overlapping relationship. For example, the light scattering layer 400 may be peripheral with respect to the light emitting layer 720, e.g., two portions of the light scattering layer 400 may be spaced apart from each other along a horizontal direction to be positioned at opposite edges of the light emitting layer 720. The light scattering layer 400 is disposed between the second substrate 201 and the pixel defining layer 190. For example, the light scattering layer 400 is disposed on, e.g., directly on, a bottom surface of the second substrate 201 facing the pixel defining layer 190.

As illustrated in FIG. 5, the light scattering layer 400 scatters light propagating toward side surfaces with respect to the front surface. That is, light emitted from the light emitting layer 720 toward portions of the second substrate 201 overlapping the pixel defining layer 190 is incident on the light scattering layer 400, and is scattered onto the second substrate 210 at many different angles by the light scattering layer 400. For example, as illustrated in FIG. 5, light L1 emitted by the light emitting layer 720 and incident on the light scattering layer 400 is scattered inside the light scattering layer 400, and is output as light L2 at many different angles in the second substrate 210. Therefore, the light scattering layer 400 may improve the viewing angle property of the display device.

In detail, referring back to FIG. 3, the light scattering layer 400 may include a first optical layer 410 and a second optical layer 420 in order to maximize the light scattering effect (enlarged portion B). The first and second optical layers 410 and 420 may be made of transparent polymer resins, e.g., polyethyleneterephthalate (PET) or acrylic resins.

The first and second optical layers 410 and 420 have refractive indices different from each other. For example, the refractive index of the second optical layer 420 is larger than the refractive index of the first optical layer 410. As the first and second optical layers 410 and 420 have different refractive indices, light refraction is increased at each boundary surface, according to Snell's law.

The second optical layer 420 may be disposed on the first optical layer 410 to face the first optical layer 410. The first and second optical layers 410 and 420 may be bonded to each other. The first and second optical layers 410 and 420 may be formed to have a prism form extended in the same direction. For example, the first and second optical layers 410 and 420 may have complementary prism shapes fitting within each other, e.g., a prism form including crests and troughs, as illustrated in FIG. 3. Light incident on the light scattering layer 400 is reflected or refracted by the prism form and propagates in many different directions. As the incident light propagates in many different directions, light diffusion may be increased. However, embodiments are not limited thereto, and the first and second optical layers 410 and 420 may be provided in many different forms capable of scattering light.

For example, as illustrated in FIG. 4, the light scattering layer 400 may include light scattering particles 430 in a base layer 440 (enlarged portion C). The base layer 440 may be, e.g., an acrylic resin. The base layer 440 and the light scattering particle 430 may have refractive indices different from each other. The diameter of the light scattering particle 430 is ⅟₁₀ of a wavelength of light or larger.

When the diameter of the light scattering particle 430 is ⅟₁₀ of the wavelength of light or larger, mie scattering may occur. The mie scattering refers to a case where forward scattering substantially predominates over the back scattering, i.e., most of the light scattering from such particles is oriented in the forward direction. The scattering particles 430 of the light scattering layer 400 induce the mie scattering, where the forward scattering is extremely higher than the back scattering, thereby improving the viewing angle property by the light scattering.

As described above, the diameter of the light scattering particle 430 is required to be ⅟₁₀ of the wavelength of light or larger in order to induce the mie scattering. In consideration of the wavelength of light emitted from the light emitting layer 720 of the organic light emitting display device 100, the red, green, and blue sub-pixels of the light scattering particle 430 may have diameters of about 70 nm or larger, about 55 nm or larger, and about 40 nm or larger, respectively.

However, as it is difficult to manufacture a light scattering particle having a diameter of about 40 nm to about 70 nm, it is desirable that the light scattering particle 430 has a diameter of about 150 nm or larger in order to induce the forward scattering. Further, when the diameter of the light scattering particle 430 is too large, the light scattering layer 400 may become too thick. Therefore, the diameter of the light scattering particle 430 may be about 40 nm to about 1000 nm, i.e., about 1 μM.

The light scattering layer 400 may overlap the pixel defining layer 190 but may not overlap the light emitting layer 720. That is, the light scattering layer 400 may be formed only on the non-light emitting area.

If the light scattering layer were to be formed on the light emitting area, i.e., to overlap the light emitting layer 720, luminance would be reduced when viewed from the front side. That is, the viewing angle improvement and the front luminance have a trade-off relationship. However, as the light scattering layer 400 is formed only on the area overlapping the pixel defining layer 190, the light scattering layer 400 according to an embodiment may not affect the luminance of the display device viewed from the front side while improving the viewing angle property.

The light emitted from the light emitting layer 720 is uniformly radiated in all directions, as illustrated in FIG. 5. In particular, the light propagating toward the light scattering layer 400 is about 50% or more of the total light. An area ratio of the light emitting layer 720 to the light scattering layer 400 may be adjusted to increase the ratio of light propagating toward the light scattering layer 400 with respect to the total light.

In a general display device, the pixel defining layer and the light emitting layer may have an area ratio of about 7:3. However, as the light scattering layer 400 overlaps the pixel defining layer 190 according to an embodiment, the light scattering layer 400 has a maximized area that is the same as the area of the pixel defining layer 190.

For example, in a case of a display device having a small screen as a smart phone, users usually look at the screen from the front side, e.g., the issue of an image quality in accordance with the viewing angle may be less frequent. Therefore, in the case of the display device having the small screen, the light emitting layer 720 and the light scattering layer 400 have an area ratio of 1:1. That is, the light scattering layer 400 may have the same area as the light emitting layer 720.

In another example, in the case of a display device having a large screen as a television, the issue of an image quality according to the viewing angle is frequent. That is because users may look at a display device with a large screen from different angles. Therefore, in the case of the display device having the large screen, the light emitting layer 720 and the light scattering layer 400 have an area ratio of about 1:2.3. That is, the light scattering layer 400 may have a substantially same area as the pixel defining layer 190, thereby increasing light scattering of light propagating toward side surfaces, e.g., edge of the light emitting layer 720.

Thus, the light emitting layer 720 and the light scattering layer 400 have an area ratio of about 1:1 to about 1:2.3.

Hereinafter, an organic light emitting display device according to another embodiment will be described with reference to FIG. 6. The repeated description will not be provided.

Figure 6:
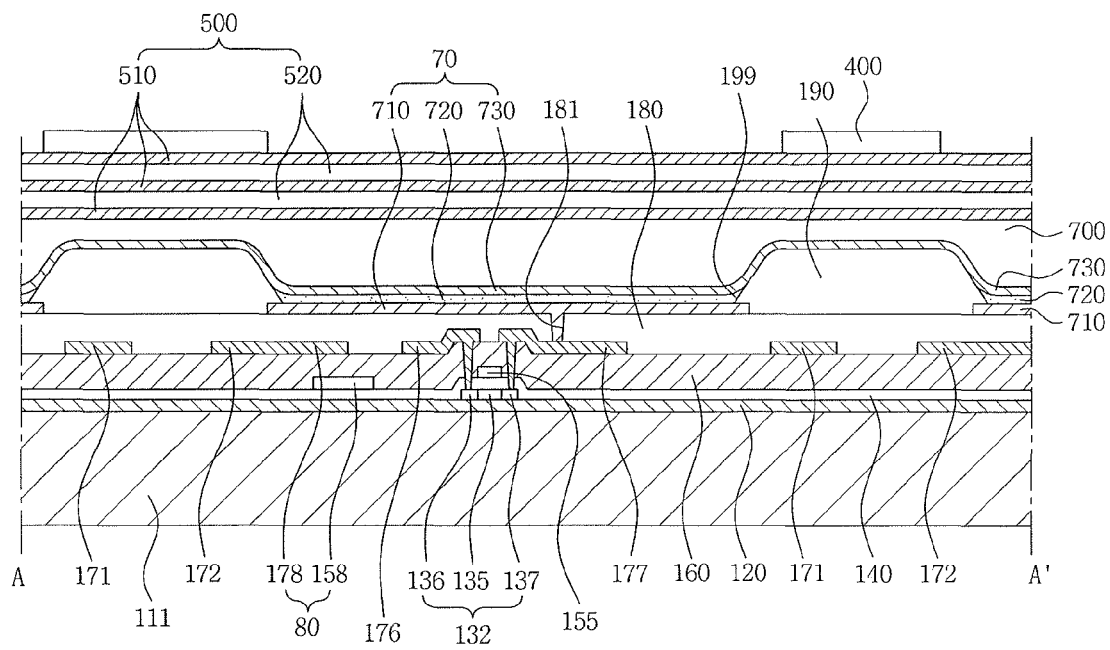
FIG. 6 illustrates a cross-sectional view of a display device according to another embodiment.

FIG. 6 is a cross-sectional view illustrating a display device according to another embodiment.

Referring to FIG. 6, an organic light emitting display device according to another embodiment is substantially the same as the organic light emitting display device 100 of FIGS. 1-5, except additionally including a capping layer 700 and a thin film encapsulation layer 500.

The capping layer 700 is configured to protect the OLED 70 before the thin film encapsulation layer 500 is formed, and to prevent the OLED 70 from being damaged during formation of the thin film encapsulation layer 500. The capping layer 700 is disposed on the second electrode 730. However, embodiments are not limited thereto, e.g., the capping layer 700 may be omitted to be replaced with an organic layer 520 of the thin film encapsulation layer 500.

The capping layer 700 may be made of an ultraviolet (UV)-blocking layer configured to block UV rays that may exert adverse effects on the OLED 70. For example, the UV rays may be radiated so as to form the organic layer 520 of the thin film encapsulation layer 500. In this case, the capping layer 700 having a UV-blocking property may be formed in order to prevent damage to the OLED 70.

The capping layer 700 may have a single-layer structure or a multi-layer structure having two or more layers. The capping layer 700 may also have properties of preventing penetration of moisture or oxygen.

The thin film encapsulation layer 500 may be formed on the capping layer 700. For example, the thin film encapsulation layer 500 may be, e.g., directly, formed on the OLED 70 to encapsulate the driving circuit and the OLED. The thin film encapsulation layer 500 may substitute for the second substrate 201 illustrated in FIG. 3.

The thin film encapsulation layer 500 may have a structure including two or more inorganic layers 510 and two or more organic layers 520. Herein, the inorganic layer 510 and the organic layer 520 are alternately laminated. FIG. 6 illustrates that three inorganic layers 510 and two organic layers 520 are alternately laminated to form the thin film encapsulation layer 500, but the number of the inorganic layers 510 and the organic layers 520 is not limited thereto.

The inorganic layer 510 may include at least one of, e.g., aluminum oxides ($Al_2O_3$) or silicon oxides ($SiO_2$). The organic layer 520 may include at least one of, e.g., epoxy, acrylates, and urethane acrylates. The inorganic layer 510 is configured to prevent penetration of moisture and oxygen into the display unit, and the organic layer 520 is configured to reduce internal stress of the inorganic layer 510 or filling micro-cracks and pinholes of the inorganic layer 510.

The light scattering layer 400 overlaps the pixel defining layer 190, i.e., without overlapping the light emitting layer 720. The light scattering layer 400 may be formed on an uppermost surface of the thin film encapsulation layer 500. Although the light scattering layer 400 is disposed at a different height, i.e., in contact with a different element, the light scattering layer 400 plays the same role in improving the viewing angle property without impacting the luminance recognized from the front side as in the organic light emitting display 100 of FIGS. 1-5.

Hereinafter, a display device according to yet another embodiment will be described with reference to FIG. 7. A repeated description of elements described previously with respect to the organic light emitting display 100 of FIGS. 1-5 will not be provided.

Figure 7:
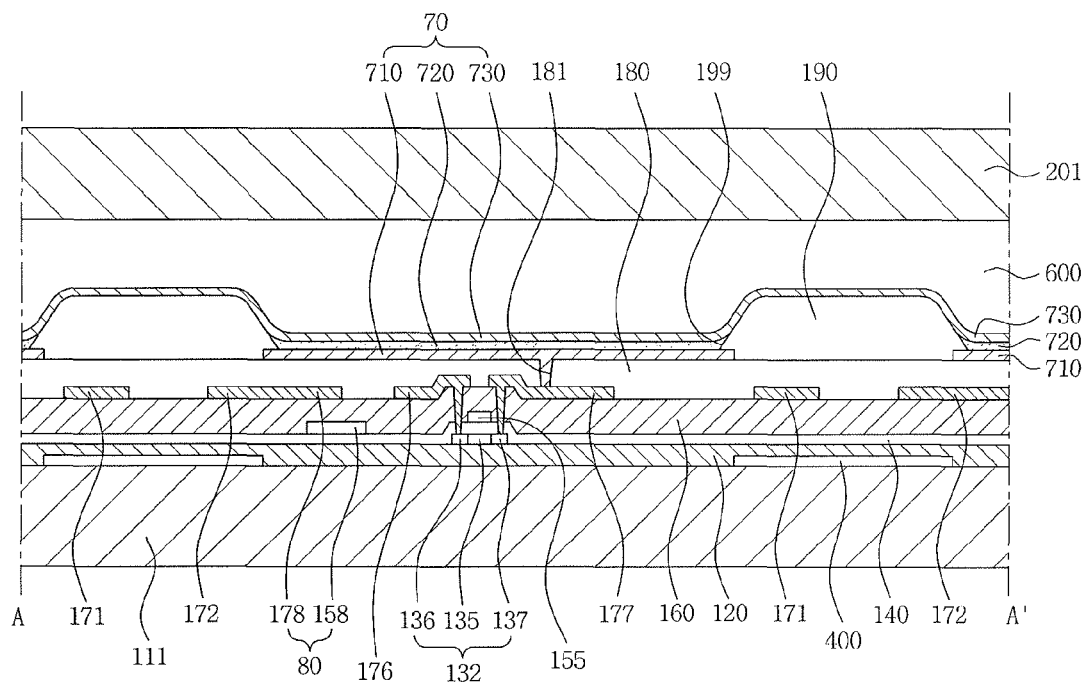
FIG. 7 illustrates a cross-sectional view of a display device according to yet another embodiment.

FIG. 7 is a cross-sectional view illustrating a display device according to yet another embodiment.

Referring to FIG. 7, an organic light emitting display device according to this embodiment is substantially the same as the organic light emitting display device 100 of FIGS. 1-5, except for the position of the light scattering layer 400. That is, as illustrated in FIG. 7, the light scattering layer 400 is disposed between the first substrate 111 and the pixel defining layer 190. For example, the light scattering layer 400 is formed on, e.g., directly on, the first substrate 111.

The buffer layer 120 is disposed on the light scattering layer 400. The buffer layer 120 is disposed between the pixel defining layer 190 and the light scattering layer 400. For example, the light scattering layer 400 may be disposed inside the buffer layer 120.

The organic light emitting display device according to the present embodiment is a bottom-emission type. Therefore, the light scattering layer 400 may be disposed on the first substrate 111 instead of the second substrate 201 depending on the light emitting direction. Although the light scattering layer 400 is disposed at a different height, e.g., as compared to the embodiments in FIGS. 1-6, the light scattering layer 400 plays the same role in improving the viewing angle property without impacting the luminance recognized from the front side as in the light scattering layer 400 in FIGS. 1-6.

By way of summation and review, sub pixels in a conventional flat display may be arranged in a resonance structure in order to improve light extraction efficiency of the display. That is, transflective and reflective electrodes may be used for the resonance structure, so light may propagate back and forth between the two electrodes. As such, constructive interference may occur between the electrodes, thereby increasing light extraction efficiency from each of the sub pixels.

However, when such a resonance structure is used and a strong resonance occurs, while the light extraction efficiency may be improved, the viewing angle property may deteriorate due to extreme straightness of light. That is, color shift may be increased in accordance with the viewing angle in the structure with the strong resonance.

In contrast, a display device according to embodiments is capable of improving a viewing angle property without impacting the front-side light extraction efficiency by including a light scattering layer above the pixel defining layer. Further, the display device is capable of adjusting the viewing angle property depending on the size of the display device, thereby realizing a reliable product.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a first substrate;
    a pixel defining layer on the first substrate, the pixel defining layer defining a pixel region on the first substrate;
    a first electrode on the pixel region;
    a light emitting layer on the first electrode;
    a second electrode on the light emitting layer;
    a second substrate facing the first substrate; and
    a light scattering layer overlapping the pixel defining layer, the light scattering layer having a non-overlapping relationship with the light emitting layer.

2. The display device as claimed in claim 1, wherein the light emitting layer and the light scattering layer have an area ratio of about 1:1 to about 1:2.3.

3. The display device as claimed in claim 1, wherein the light scattering layer is between the second substrate and the pixel defining layer.

4. The display device as claimed in claim 3, wherein the light scattering layer is on a bottom surface of the second substrate facing the pixel defining layer.

5. The display device as claimed in claim 1, wherein the light scattering layer includes a first optical layer and a second optical layer having different refractive indices from each other.

6. The display device as claimed in claim 5, wherein the second optical layer is on the first optical layer.

7. The display device as claimed in claim 6, wherein the first optical layer and the second optical layer have a prism form.

8. The display device as claimed in claim 1, wherein the light scattering layer includes a base layer and light scattering particles inside the base layer.

9. The display device as claimed in claim 1, wherein the light scattering layer is disposed between the first substrate and the pixel defining layer.

10. The display device as claimed in claim 9, further comprising a buffer layer between the pixel defining layer and the first substrate.

11. The display device as claimed in claim 10, wherein the buffer layer is between the pixel defining layer and the light scattering layer.

12. A display device, comprising:
   a substrate;
   a pixel defining layer on the first substrate, the pixel defining layer defining a pixel region on the first substrate;
   a first electrode on the pixel region;
   a light emitting layer on the first electrode;
   a second electrode on the light emitting layer;
   a thin film encapsulation layer on the second electrode; and
   a light scattering layer overlapping the pixel defining layer, the light scattering layer having a non-overlapping relationship with the light emitting layer.

13. The display device as claimed in claim 12, wherein the light emitting layer and the light scattering layer have an area ratio of about 1:1 to about 1:2.3.

14. The display device as claimed in claim 12, wherein the light scattering layer is on the thin film encapsulation layer.

15. The display device as claimed in claim 12, wherein the light scattering layer includes a first optical layer and a second optical layer having different refractive indices from each other.

16. The display device as claimed in claim 15, wherein the second optical layer is on the first optical layer.

17. The display device as claimed in claim 16, wherein the first optical layer and the second optical layer have a prism form.

18. The display device as claimed in claim 12, wherein the light scattering layer includes a base layer and light scattering particles inside the base layer.

19. The display device as claimed in claim 12, wherein the light scattering layer is between the first substrate and the pixel defining layer.

20. The display device as claimed in claim 19, further comprising a buffer layer between the pixel defining layer and the first substrate.

* * * * *